United States Patent
Bank et al.

(10) Patent No.: US 9,748,430 B2
(45) Date of Patent: Aug. 29, 2017

(54) STAIRCASE AVALANCHE PHOTODIODE WITH A STAIRCASE MULTIPLICATION REGION COMPOSED OF AN AIINASSB ALLOY

(71) Applicants: Board of Regents, The University of Texas System, Austin, TX (US); University of Virginia Patent Foundation, Charlottesville, VA (US)

(72) Inventors: Seth Bank, Austin, TX (US); Scott Maddox, Austin, TX (US); Wenlu Sun, Charlottesville, VA (US); Joe Campbell, Charlottsville, VA (US)

(73) Assignees: Board of Regents, The University of Texas System, Austin, TX (US); University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 15/185,914

(22) Filed: Jun. 17, 2016

(65) Prior Publication Data
US 2016/0372623 A1    Dec. 22, 2016

Related U.S. Application Data

(60) Provisional application No. 62/181,519, filed on Jun. 18, 2015.

(51) Int. Cl.
*H01L 31/00*    (2006.01)
*H01L 31/107*   (2006.01)
*H01L 31/0304*  (2006.01)

(52) U.S. Cl.
CPC .... *H01L 31/1075* (2013.01); *H01L 31/03046* (2013.01)

(58) Field of Classification Search
CPC .......... H01L 31/1075; H01L 31/03046; H01L 31/0261
See application file for complete search history.

(56) References Cited

U.S. PATENT DOCUMENTS 4,694,318 A    9/1987  Capasso et al.
4,755,860 A    7/1988  Allam et al.
(Continued)

FOREIGN PATENT DOCUMENTS

WO          0227805 A2    4/2002

OTHER PUBLICATIONS

Woodson et al., "Low-Noise AlInAsSb Avalanche Photodiode," Applied Physics Letters, vol. 108, 081102, 2016, pp. 1-4.
(Continued)

*Primary Examiner* — Nikolay Yushin
(74) *Attorney, Agent, or Firm* — Robert A. Voigt, Jr.; Winstead, P.C.

(57) ABSTRACT

A staircase avalanche photodiode with a staircase multiplication region composed of an AlInAsSb alloy. The photodiode includes a buffer layer adjacent to a substrate and an avalanche multiplication region adjacent to the buffer layer, where the avalanche multiplication region includes a graded AlInAsSb alloy grown lattice-matched or psuedomorphically strained on either InAs or GaSb. The photodiode further includes a photoabsorption layer adjacent to the avalanche multiplication region, where the photoabsorption layer is utilized for absorbing photons. By utilizing AlInAsSb in the multiplication region, the photodiode exhibits a direct bandgap over a wide range of compositions as well as exhibits large conduction band offsets much larger than the smallest achievable bandgap and small valance band offsets. Furthermore, the photodiode is able to detect extremely weak light with a high signal-to-noise ratio.

20 Claims, 5 Drawing Sheets

(56) References Cited

U.S. PATENT DOCUMENTS

| | | | |
|---|---|---|---|
| 4,839,706 | A | 6/1989 | Brennan |
| 4,942,436 | A | 7/1990 | Vetterling |
| 5,457,327 | A | 10/1995 | Taguchi |
| 5,539,221 | A | 7/1996 | Tsuji et al. |
| 6,326,650 | B1 | 12/2001 | Allam |
| 7,829,915 | B2 * | 11/2010 | Shi .................. H01L 31/02027 |
| | | | 257/186 |

OTHER PUBLICATIONS

Ren et al., "Low Excess Noise AlInAsSb Staircase Avalanche Photodiode," 73rd Annual Device Research Conference (DRC), Jun. 21-24, 2015, pp. 1-2.

Ren et al., "AlInAsSb/GaSb Staircase Avalanche Photodiode," Applied Physics Letters, vol. 108, 081101, 2016, pp. 1-4.

Maddox et al., "Growth and Properties of Broadly-Tunable AlInAsSb Digital Alloys on GaSb," 57th Electronic Materials Conference, Columbus, Ohio, Jun. 24-26, 2015, see Abstract, pp. 1-2.

Scott J. Maddox, "High-Gain, Low-Noise Avalanche Photodiodes Grown by Molecular Beam Epitaxy," PhD Oral Defense, University of Texas at Austin, Apr. 30, 2015, pp. 1-55, Grace Period Disclosure.

Wenlu Sun, "Theoretical Study and Monte Carlo Simulation of III-V Compound Photodiodes," PhD Oral Defense, University of Virginia, Dec. 1, 2014, pp. 1-49, Grace Period Disclosure.

\* cited by examiner

STAIRCASE AVALANCHE PHOTODIODE WITH A STAIRCASE MULTIPLICATION REGION COMPOSED OF AN AIINASSB ALLOY

GOVERNMENT INTERESTS

This invention was made with government support under Grant Nos. W911NF-10-1-0391 and W911NF-12-1-0428 awarded by the Army Research Office. The U.S. government has certain rights in the invention.

TECHNICAL FIELD

The present invention relates generally to avalanche photodiodes, and more particularly to a staircase avalanche photodiode with a staircase multiplication region composed of an aluminum indium arsenide antimonide (AlInAsSb) alloy.

BACKGROUND

An avalanche photodiode (APD) is a highly sensitive semiconductor electronic device that exploits the photoelectric effect to convert light to electricity. APDs can be thought of as photodetectors that provide a built-in first stage of gain through avalanche multiplication. From a functional standpoint, they can be regarded as the semiconductor analog to photomultipliers. By applying a high reverse bias voltage (typically 100-200 V in silicon), APDs show an internal current gain effect (often around 100×) due to impact ionization (avalanche effect).

Figure 1A:
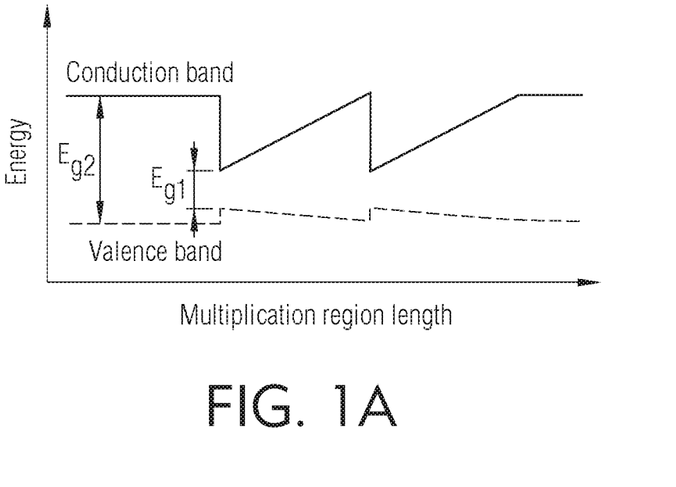
FIGS. 1A-1B illustrate the band structure diagrams of a two-step staircase avalanche photodiode at zero bias and under reverse bias, respectively, in accordance with an embodiment of the present invention.
Figure 1B:
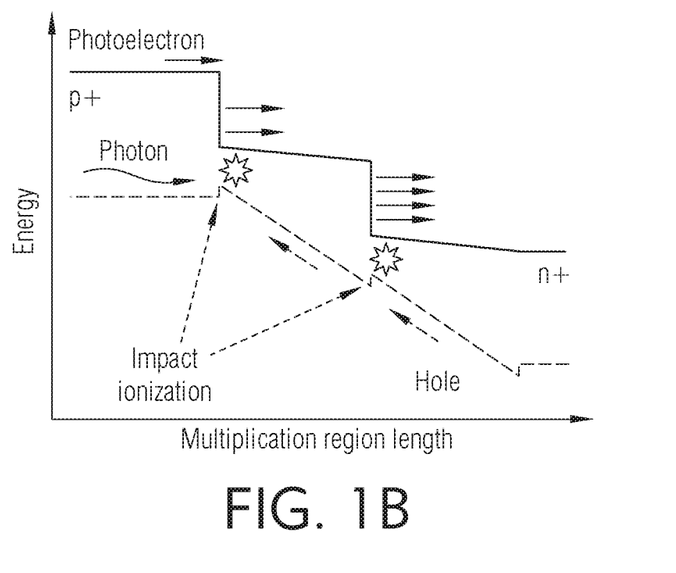

The internal gain of APDs can provide higher sensitivity than p-i-n photodiodes, which is beneficial for many optical communication and sensing applications. However, as discussed above, the origin of the APD gain is impact ionization, a stochastic process that results in excess noise and limits the gain-bandwidth product. The noise power spectral density of an APD, $\phi$, is given by the expression $\phi = 2q \cdot I \cdot M^2 \cdot F(M) \cdot R(\omega)$ where q is the charge on an electron, I is the current, M is the avalanche gain, F(M) is the excess noise factor caused by the random nature of the multiplication process, and $R(\omega)$ is the device impedance. For the past four decades, reducing the excess noise factor, F(M), has been a focus of APD research and development. One structure that was proposed to achieve very low noise is referred to as the "staircase APD." The band structure diagrams of a two-step staircase avalanche photodiode at zero bias and under reverse bias are illustrated in FIGS. 1A and 1B, respectively, in accordance with an embodiment of the present invention. Referring to FIGS. 1A and 1B, unlike conventional APDs, in which impact ionization occurs relatively uniformly throughout the entire multiplication region, in the staircase structure, avalanche events occur proximate to the sharp bandgap discontinuity. As electrons in the wide bandgap region ($E_{g2}$) move into the narrow bandgap region ($E_{g1}$), their excess energy enables immediate impact ionization. These discontinuities function somewhat like dynodes in a photomultiplier in which the gain position is localized. As a result, the gain process is more deterministic, with concomitant reduction in gain fluctuations, and, thus, lower excess noise. Unfortunately, initial studies of staircase APDs used the $Al_xGa_{1-x}As$ material system, which has inadequate band offsets and the projected noise characteristics were never achieved. That is, current staircase APDs exhibit indirect bandgaps, small conduction band offsets relative to the smallest achievable bandgap and large valence band offsets.

SUMMARY

In one embodiment of the present invention, a photodiode comprises an avalanche multiplication region, where the avalanche multiplication region comprises a graded aluminum indium arsenide antimonide (AlInAsSb) alloy grown lattice-matched or psuedomorphically strained on either indium arsenide (InAs) or gallium antimonide (GaSb), where the graded avalanche multiplication region comprises multiple steps in which a bandgap is varied from small to large and vice-versa. The photodiode further comprises a photoabsorption layer for absorbing photons.

The foregoing has outlined rather generally the features and technical advantages of one or more embodiments of the present invention in order that the detailed description of the present invention that follows may be better understood. Additional features and advantages of the present invention will be described hereinafter, which may form the subject of the claims of the present invention.

BRIEF DESCRIPTION OF THE DRAWINGS

A better understanding of the present invention can be obtained when the following detailed description is considered in conjunction with the following drawings, in which.

DETAILED DESCRIPTION

Figure 2:
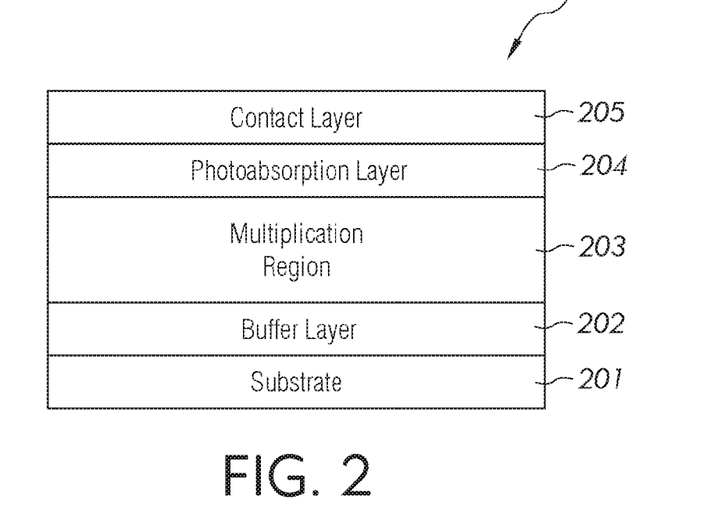
FIG. 2 illustrates a schematic cross section of the compositionally-graded $Al_xIn_{1-x}As_ySb_{1-y}$ staircase avalanche photodiode in accordance with an embodiment of the present invention.

As discussed herein, the principles of the present invention provide an ultra-low-noise staircase APD. The structure of such a staircase APD is based on the $Al_xIn_{1-x}As_ySb_{1-y}$ material system as discussed below in connection with FIG.

2. FIG. 2 illustrates a schematic cross section of the staircase avalanche photodiode 200 with a staircase multiplication region composed of a graded aluminum indium arsenide antimonide (AlInAsSb) alloy grown lattice-matched or psuedomorphically strained on either indium arsenide (InAs) or gallium antimonide (GaSb) in accordance with an embodiment of the present invention.

As discussed further herein, the graded AlInAsSb alloy exhibits a direct bandgap over a wide range of compositions as well as exhibits large conduction band offsets much larger than the smallest achievable bandgap and small valance band offsets. Such a staircase APD using the $Al_xIn_{1-x}As_ySb_{1-y}$ material system is the first staircase alloy to exhibit all three of these important characteristics. Furthermore, such a staircase APD is able to detect extremely weak light with a high signal-to-noise ratio.

FIG. 2 illustrates a schematic cross section of the compositionally-graded $Al_xIn_{1-x}As_ySb_{1-y}$ staircase APD 200 in accordance with an embodiment of the present invention.

Referring to FIG. 2, APD 200 includes a substrate 201 (e.g., InAs substrate, GaSb substrate), a buffer layer 202 (e.g., InAs, GaSb) positioned on top of substrate 201, an avalanche multiplication region 203 (graded AlInAsSb alloy grown lattice-matched or psuedomorphically strained on either InAs or GaSb) positioned on top of buffer layer 202, a photoabsorption layer 204 (e.g., graded gallium antimonide (GaSb)) for absorbing photons, where photoabsorption layer 204 is positioned on top of avalanche multiplication region 203, and a contact layer 205 (e.g., gallium antimonide (GaSb)) positioned on top of photoabsorption layer 204. In one embodiment, substrate 201 is n-type, buffer layer is n-doped and contact layer 205 is p-doped. In another embodiment, substrate 201 is p-type, buffer layer is p-doped and contact layer 205 is n-doped. In one embodiment, the structure of APD 200 as shown in FIG. 2 may be inverted (i.e., substrate 201 is the top layer and contact layer 205 is the bottom layer of APD), such as utilized in focal plane arrays. In one embodiment, each of the layers of APD 200 is grown by molecular beam epitaxy. In one embodiment, graded avalanche multiplication region 203 includes multiple steps in which a bandgap is varied from small to large and vice-versa.

While FIG. 2 illustrates APD 200 as including both substrate 201 and buffer layer 202, the principles of the present invention include variations not depicted in FIG. 2, such as having substrate 201 and/or buffer layer 202 removed in the final device. Substrate 201 and buffer layer 202 may only be required during the layer growth to provide a crystalline template.

Furthermore, while the preceding discusses avalanche multiplication region 203 as corresponding to a graded AlInAsSb alloy grown lattice-matched or psuedomorphically strained on either InAs or GaSb, the principles of the present invention are to include other variations, such as additional materials that could be added to aluminum indium arsenide antimonide, such as gallium antimonide (GaSb), thereby producing aluminum gallium indium arsenide antimonide (AlGaInAsSb). A person of ordinary skill in the art would be capable of applying the principles of the present invention to such implementations. Further, embodiments applying the principles of the present invention to such implementations would fall within the scope of the present invention.

Figure 3:
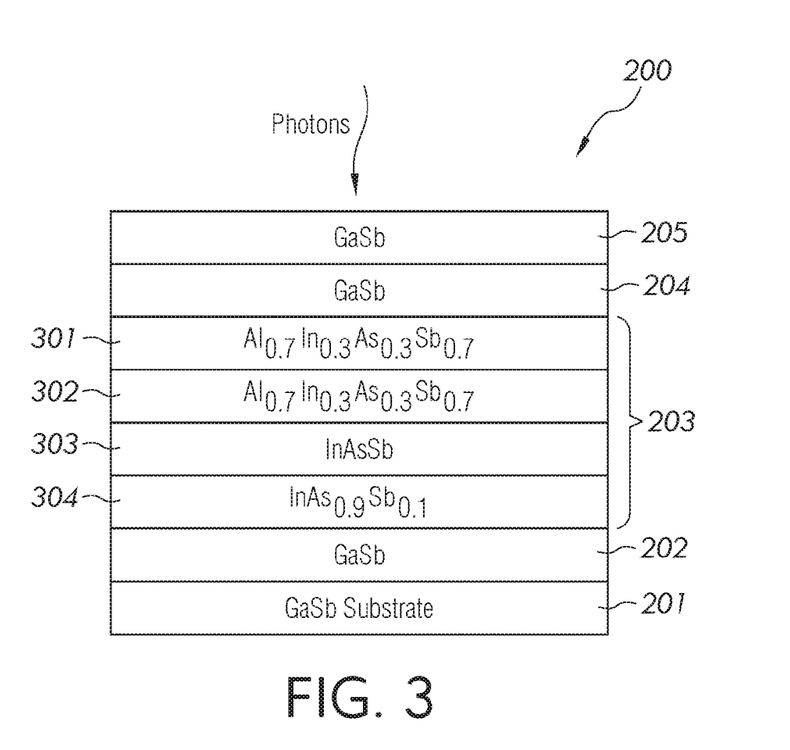
FIG. 3 provides a more detailed illustration of the layers of a single-step instance of the staircase avalanche photodiode of FIG. 2 in accordance with an embodiment of the present invention.

A more detailed illustration of the layers of APD 200 according to one embodiment is provided below in connection with FIG. 3. FIG. 3 illustrates a more detailed illustration of the layers of a single-step instance of the compositionally-graded $Al_xIn_{1-x}As_ySb_{1-y}$ staircase APD 200 in accordance with an embodiment of the present invention.

Referring to FIG. 3, APD 200 includes a substrate 201 composed of GaSb with a buffer layer 202 of GaSb positioned on top of substrate 201. In one embodiment, buffer layer 202 has a thickness approximately between 10 nanometers and 10 micrometers. Furthermore, as illustrated in FIG. 3, avalanche multiplication region 203, positioned on top of buffer layer 202, is composed of a graded aluminum indium arsenide antimonide (AlInAsSb) alloy with layers 301-304 lattice matched to InAs. For example, layer 301 is composed of AlInAsSb ($Al_{0.7}In_{0.3}As_{0.3}Sb_{0.7}$) with a thickness approximately between 10 nanometers and 2 micrometers. Layer 302 is composed of AlInAsSb ($Al_{0.7}In_{0.3}As_{0.3}Sb_{0.7}$) with a thickness approximately between 1 nanometer and 100 nanometers. Layer 303 is composed of InAsSb ($InAs_{0.9}Sb_0$) with a thickness approximately between 1 nanometer and 100 nanometers. Layer 304 is composed of indium arsenide antimonide (InAsSb) ($InAs_{0.9}Sb_{0.1}$) with a thickness approximately between 30 nanometers and 1 micrometer.

While FIG. 3 illustrates four layers 301-304 comprising avalanche multiplication region 203, the principles of the present invention are not to be limited in scope to utilizing all four layers 301-304. For example, layers 301, 302 and/or 303, which are used to modify the device physics, may not be utilized in certain embodiments.

A further description of layers 301-304 is provided below. In one embodiment, layer 301 is utilized for growth on gallium antimonide because of the band alignment between gallium antimonide and the smaller bandgap material, indium arsenide antimonide (InAsSb). In essence, layer 301 functions as a tunneling blocking layer. In one embodiment, the smaller bandgap layer of InAsSb may additionally contain small fractions of aluminum and/or gallium thereby making it AlGaInAsSb if both aluminum and gallium were added. In one embodiment, layer 301 performs optimally with a thickness of less than 200 nanometers. In one embodiment, layer 302 corresponds to a graded bandgap layer that prevents holes from accumulating in the narrow bandgap region. In one embodiment, layer 303 provides extra space for the electrons to impact ionize. In one embodiment, layer 304 utilizes a graded bandgap material that grades from a narrow bandgap region to a wide bandgap region. Layer 304 allows electrons to drift or diffuse to the next step in avalanche multiplication region 203 and at the next step the electrons impact ionize.

As further illustrated in FIG. 3, photoabsorption region 204 (e.g., gallium antimonide (GaSb)) is positioned on top of avalanche multiplication region 203, where photoabsorption region 204 has a thickness approximately between 30 nanometers and 50 micrometers, with an optimal thickness approximately three absorption depths. Furthermore, as illustrated in FIG. 3, contact layer 205 (e.g., gallium antimonide (GaSb)) is positioned on top of photoabsorption region 204 with a thickness approximately 100 nanometers.

A further description regarding APD 200 (FIGS. 2 and 3) is provided below.

Electrons crossing the $Al_{0.7}In_{0.3}As_{0.3}Sb_{0.7}/InAs_{0.9}Sb_{0.1}$ (302/304) heterointerface gain $\sim 2E_g$ of kinetic energy, greater than the $\sim 1.5E_g$ necessary for a high probability of impact ionization. Another benefit of the AlInAsSb system is that its k value, the ratio of the electron and hole ionization coefficients, is close to zero, which suppresses excess noise.

Figure 4:
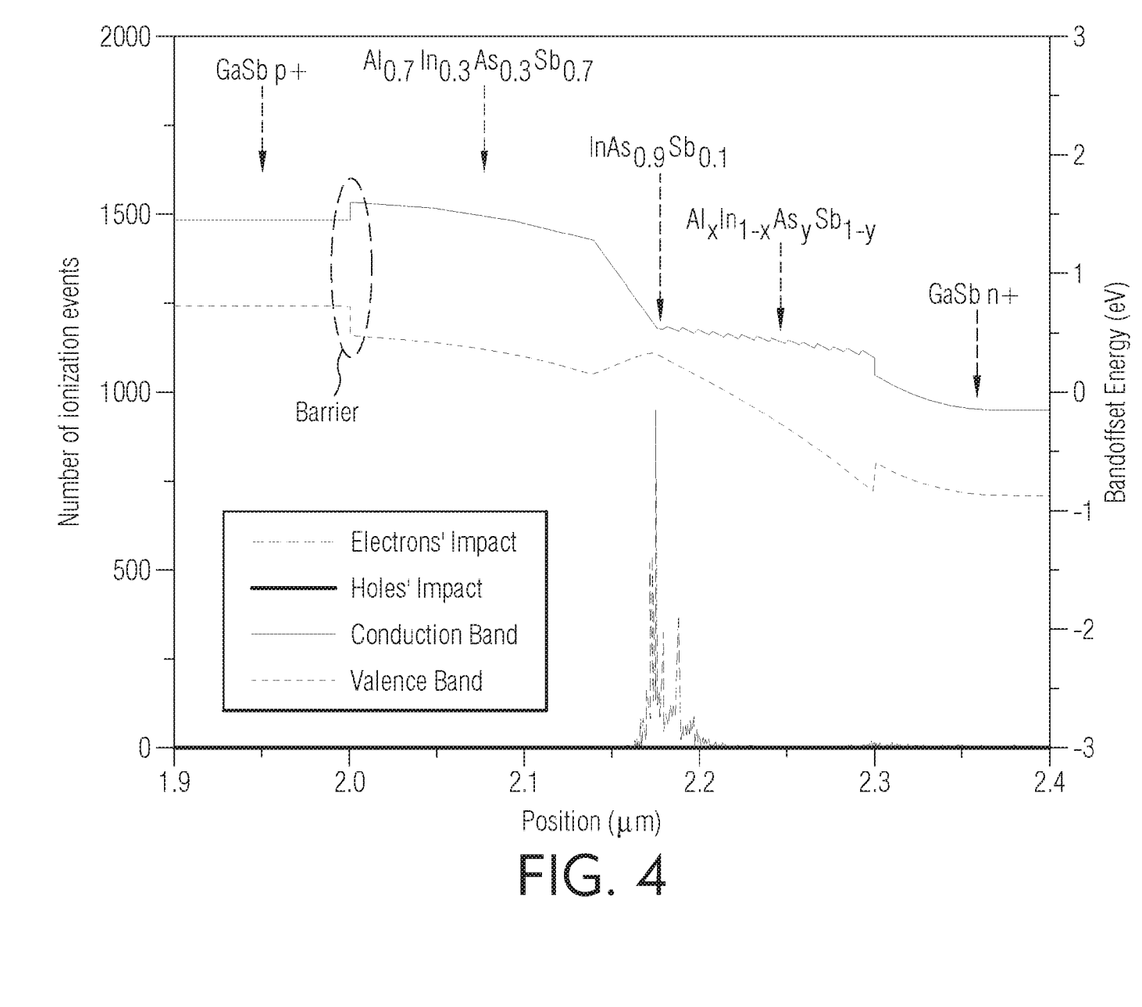
FIG. 4 illustrates the result of the Monte Carlo simulation of the band diagram and impact ionization distribution for a bias of −1 volts in accordance with an embodiment of the present invention.

To demonstrate the AlInAsSb staircase APD 200, a one-stage staircase structure 200 was grown on $n^+$ GaSb substrate 201 and capped with a $p^+$ GaSb 205. Monte Carlo was used to simulate the band diagram and impact ionization distribution. FIG. 4 illustrates the result of the Monte Carlo simulation of the band diagram and impact ionization distribution for a bias of −1 volts in accordance with an embodiment of the present invention.

Referring to FIG. 4, it is clear that essentially all impact ionizations originate with electrons and occur within the 6 nm-thick narrow bandgap $InAs_{0.9}Sb_{0.1}$ region 304. Hole initiated ionization is negligible, a condition for low excess noise. 100 μm diameter devices were fabricated and tested with a 1.5 μm continuous wave (CW) laser source.

Figure 5:
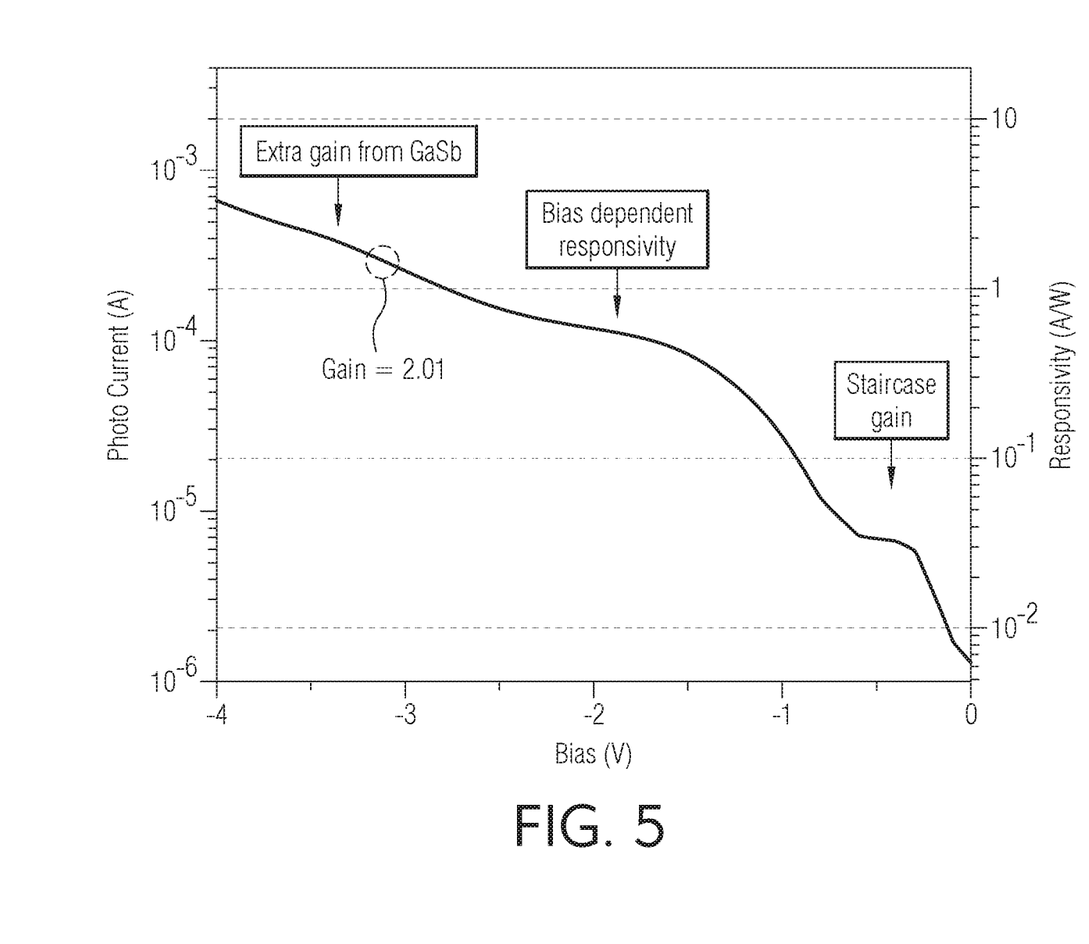
FIG. 5 illustrates the photo current-voltage and responsivity-voltage characteristics of a 100 μm diameter mesa staircase avalanche photodiode in accordance with an embodiment of the present invention.

FIG. 5 illustrates the photo current-voltage and responsivity-voltage characteristics of a 100 μm diameter mesa staircase APD 200 in accordance with an embodiment of the present invention. Referring to FIGS. 2-3 and 5, the heterojunction at the GaSb/AlInAsSb (204/301) interface limited injection into the multiplication region 203 and dominated the photocurrent at low bias. This was confirmed by measuring the current-voltage characteristics of a control GaSb/AlInAsSb/GaSb heterojunction APD and the estimated barrier height was ~0.15 eV. Owing to the influence of this barrier effect, the internal gain of the staircase APD 200 could not be determined directly from the photocurrent. However, it was possible to estimate conservative lower limits of the gain from the measured and calculated responsivity. The calculated responsivity was determined using known values for the absorption coefficient, electron diffusion length, and surface reflectivity of GaSb. Comparing this value to the measured responsivity yields the nominal gain. If the responsivity is less than the theoretical maximum, which is typical, then the actual gain is slightly higher than the estimated value.

There are three mechanisms that determine the photocurrent in these APDs: staircase gain, bias dependent responsivity caused by the GaSb/AlInAsSb (204/301) barrier, and conventional impact ionization in the graded photoabsorption layer 204 at high bias. From 0 V to −0.6 V, the applied electric field "flattens" the ramp in the conduction band to form the staircase shown in FIG. 1B. This releases carriers that are trapped in the triangular shaped conduction band well. This explains the initial increase in photocurrent.

Figure 6A:
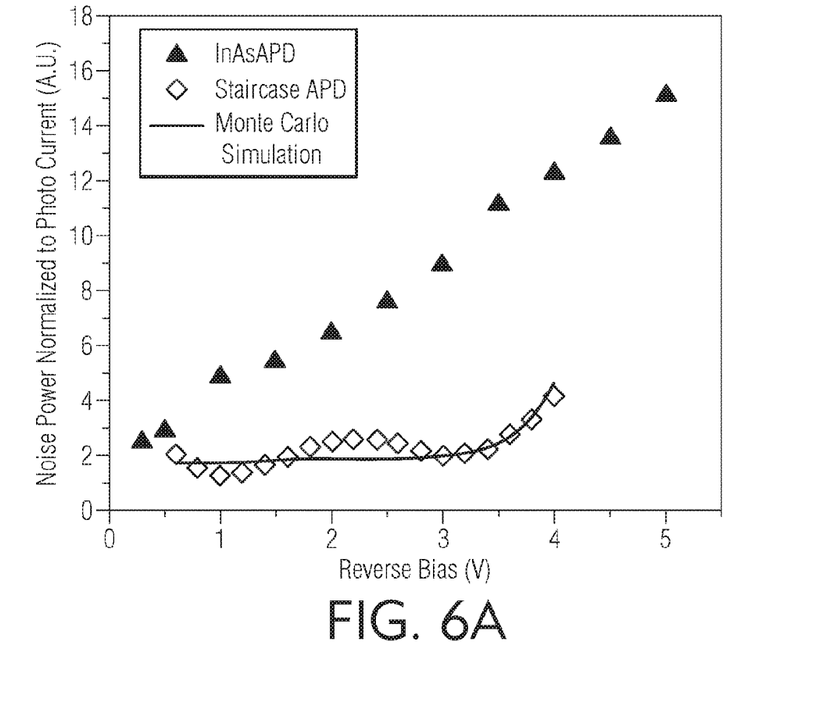
FIG. 6A illustrates the noise power normalized to photocurrent versus reverse bias of a representative indium arsenide (InAs) avalanche photodiode, the staircase avalanche photodiode of FIG. 3 and Monte Carlo simulation results in accordance with an embodiment of the present invention.

In the bias range from −0.6 V to −3.4 V, the applied field lowers the barrier at the GaSb/AlInAsSb (204/301) heterojunction, which results in an increase in photocurrent and more injection into multiplication region 203. FIG. 6A illustrates the noise power normalized to photocurrent versus reverse bias of a representative InAs APD, the staircase APD of FIG. 3 and Monte Carlo simulation results in accordance with an embodiment of the present invention. Referring to FIG. 6A, FIG. 6A shows the measured and simulated noise power spectral density normalized to the photocurrent versus bias voltage. For bias <−3.4 V, the normalized noise power is relatively independent of the bias voltage, which means that the gain is constant, and, thus, so is the excess noise factor. The gain, as determined from the responsivity, is ~2, as expected for a single staircase since each electron ionizes once as it crosses the bandgap step. It is noted that a higher staircase gain can be achieved, without an increase in noise, by increasing the number of steps. For higher bias, normalized noise increases as impact ionization begins to occur. The measured excess noise factor, F(M), still only increases to 1.1 at −3.4 V. This low noise, which is comparable to that of a photomultiplier tube, is due to the staircase structure and low-noise material. Also shown in FIG. 6A is the normalized noise power of an InAs APD with a 1.5 μm-thick multiplication region 203. While these APDs have been shown to exhibit very low excess noise, the normalized noise power, which is proportional to $M^2$, increases through the bias dependence of the gain.

Figure 6B:
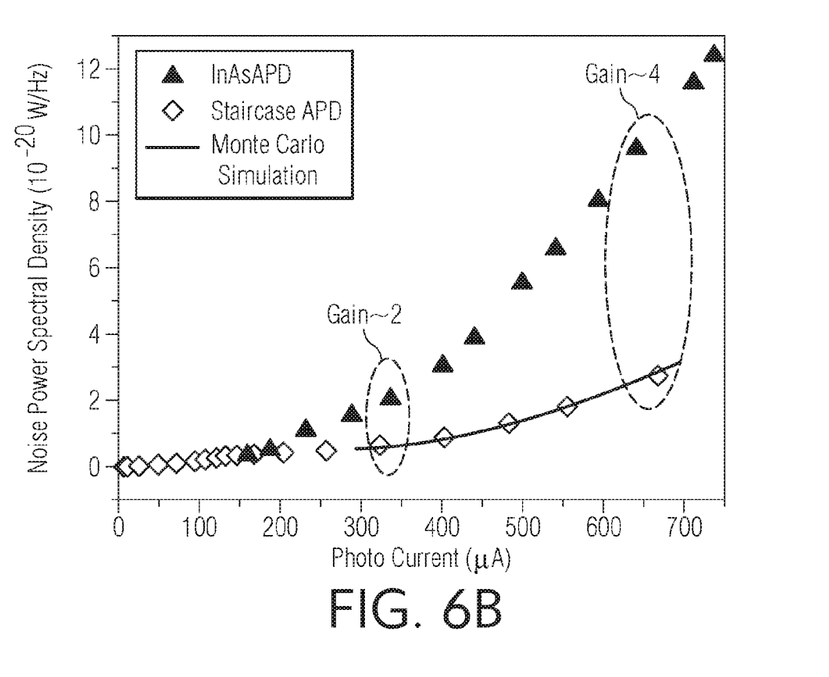
FIG. 6B illustrates the noise power versus photocurrent comparison of a representative indium arsenide (InAs) avalanche photodiode, the staircase avalanche photodiode of FIG. 3 and Monte Carlo simulation results in accordance with an embodiment of the present invention.

FIG. 6B illustrates the noise power versus photocurrent comparison of a representative InAs APD, the staircase APD of FIG. 3 and Monte Carlo simulation results in accordance with an embodiment of the present invention. Referring to FIG. 6B, FIG. 6B compares the noise power spectral density versus photocurrent for the staircase APD to the InAs APD.

Hence, as discussed herein, the staircase APD of the present invention can be used to create extremely low-noise, high-gain avalanche photodiodes operating at wavelengths ranging from the visible to the far-infrared by varying the bandgap of a separate absorption region. With an appropriate design, the staircase APD of the present invention operating at room temperature may provide high-speed, linear-mode, single-photon counting at the fiber-optic telecommunications wavelengths of 1.3 and 1.55 μm. Furthermore, the staircase APD of the present invention may also be used to improve the range of traditional fiber-optic telecommunications. Additionally, the staircase APD of the present invention may also benefit applications requiring sensitive detectors at other wavelengths, such as fluorescence spectroscopy, laser ranging, remote-gas sensing and thermal imaging.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A photodiode, comprising:
   an avalanche multiplication region, wherein a combination of all layers of said avalanche multiplication region comprise a graded aluminum indium arsenide antimonide (AlInAsSb) alloy grown lattice-matched or psuedomorphically strained on either indium arsenide (InAs) or gallium antimonide (GaSb), wherein said graded avalanche multiplication region comprises multiple bandgap steps in which a bandgap is varied from small to large and vice-versa; and
   a photoabsorption layer for absorbing photons.

2. The photodiode as recited in claim 1 further comprising:
   an InAs or GaSb substrate or an InAs or GaSb buffer.

3. The photodiode as recited in claim 2, where said avalanche multiplication region is adjacent to said InAs or GaSb substrate or said InAs or GaSb buffer, wherein said photoabsorption layer is adjacent to said avalanche multiplication region.

4. The photodiode as recited in claim 1, wherein said avalanche multiplication region is directly grown on top of a substrate or a buffer layer, wherein said photoabsorption layer is directly grown on top of said avalanche multiplication region.

5. The photodiode as recited in claim 1 further comprising:
   a substrate; and
   a buffer layer adjacent to said substrate.

6. The photodiode as recited in claim 5, wherein said avalanche multiplication region is positioned on top of said photoabsorption layer, wherein said buffer layer is positioned on top of said avalanche multiplication region, wherein said substrate is positioned on top of said buffer layer.

7. The photodiode as recited in claim 5, wherein said buffer layer is positioned on top of said substrate, wherein said avalanche multiplication region is positioned on top of said buffer layer, wherein said photoabsorption is positioned on top of said avalanche multiplication region.

8. The photodiode as recited in claim 5, wherein a thickness of said buffer layer is approximately between 10 nanometers and 10 micrometers.

9. The photodiode as recited in claim 1 further comprising:
   a contact layer adjacent to said photoabsorption layer.

10. The photodiode as recited in claim 9, wherein said contact layer comprises gallium antimonide.

11. The photodiode as recited in claim 10, wherein a thickness of said contact layer is approximately 100 nanometers.

12. The photodiode as recited in claim 1, wherein said avalanche multiplication region comprises a first layer of indium arsenide antimonide (InAsSb).

13. The photodiode as recited in claim 12, wherein said first layer has a thickness approximately between 30 nanometers and 1 micrometer.

14. The photodiode as recited in claim 12, wherein said avalanche multiplication region comprises a second layer of InAsSb, a third layer of aluminum indium arsenide antimonide (AlInAsSb) and a fourth layer of AlInAsSb.

15. The photodiode as recited in claim 14, wherein said fourth layer is positioned on top of said third layer which is positioned on top said second layer which is positioned on top of said first layer.

16. The photodiode as recited in claim 14, wherein a thickness of said fourth layer is approximately between 10 nanometers and 2 micrometers.

17. The photodiode as recited in claim 14, wherein a thickness of said third layer is approximately between 1 nanometer and 100 nanometers.

18. The photodiode as recited in claim 14, wherein a thickness of said second layer is approximately between 1 nanometer and 100 nanometers.

19. The photodiode as recited in claim 1, wherein said photoabsorption layer comprises gallium antimonide.

20. The photodiode as recited in claim 19, wherein a thickness of said photoabsorption layer is approximately between 30 nanometers and 50 micrometers.

\* \* \* \* \*